United States Patent
Shioya et al.

(10) Patent No.: US 6,713,383 B2
(45) Date of Patent: Mar. 30, 2004

(54) SEMICONDUCTOR DEVICE MANUFACTURING METHOD

(75) Inventors: Yoshimi Shioya, Tokyo (JP); Yuhko Nishimoto, Tokyo (JP); Tomomi Suzuki, Tokyo (JP); Shoji Ohgawara, Tokyo (JP); Kazuo Maeda, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 10/207,015

(22) Filed: Jul. 30, 2002

(65) Prior Publication Data

US 2003/0045096 A1 Mar. 6, 2003

(30) Foreign Application Priority Data

Aug. 24, 2001 (JP) .......................... 2001-254533
Jun. 3, 2002 (JP) .......................... 2002-161874

(51) Int. Cl.$^7$ .......................... H01L 21/4763
(52) U.S. Cl. .................. 438/624; 438/687; 438/772; 438/776
(58) Field of Search ................ 438/622–624, 438/687, 762, 763, 766, 772, 776, 778, 783, 784, 786, 787

(56) References Cited

U.S. PATENT DOCUMENTS 5,424,253 A    6/1995 Usami et al. ............... 437/238
6,472,231 B1 * 10/2002 Gabriel et al. .................. 438/9
6,524,944 B1 *  2/2003 Rangarajan et al. ........ 438/623

FOREIGN PATENT DOCUMENTS

EP        1 058 301 A1    2/1999

* cited by examiner

Primary Examiner—David A. Zarneke
Assistant Examiner—Asok Kumar Sarkar
(74) Attorney, Agent, or Firm—Lorusso, Loud & Kelly

(57) ABSTRACT

A surface of a copper (Cu) wiring layer formed over a semiconductor substrate is exposed to a plasma gas selected from the group consisting of an ammonia gas, a mixed gas of nitrogen and hydrogen, a $CF_4$ gas, a $C_2F_6$ gas and a $NF_3$ gas. The surface of the copper (Cu) wiring layer is then exposed to an atmosphere or a plasma of a gas selected from the group consisting of an ammonia gas, an ethylenediamine gas, a fA-diketone gas, a mixed gas consisting of the ammonia gas and a hydrocarbon gas ($C_xH_y$), and a mixed gas consisting of a nitrogen gas and the hydrocarbon gas ($C_xH_y$), and a Cu diffusion preventing insulating film is formed on the copper (Cu) wiring layer.

12 Claims, 13 Drawing Sheets

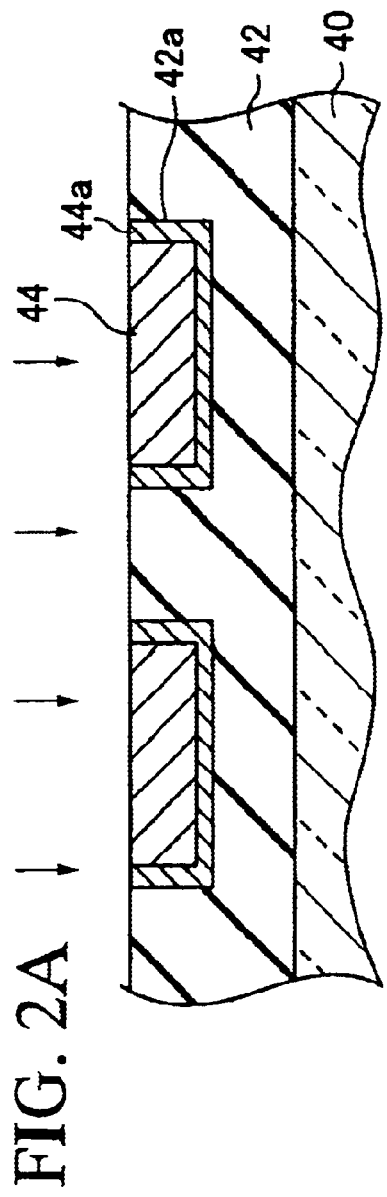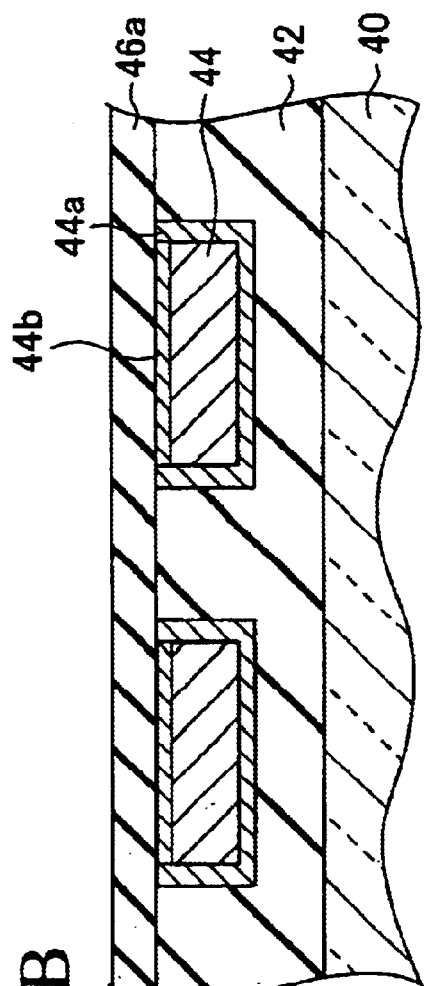
FIG. 2A
FIG. 2B

SEMICONDUCTOR DEVICE MANUFACTURING METHOD

BACKGROUND OF THE INVENTION a) Field of the Invention

The present invention relates to a semiconductor device manufacturing method and, more particularly, the technology of preventing diffusion of Cu in a copper (Cu) wiring layer in a multi-layered wiring conductor device.

b) Description of the Prior Art

An LSI is manufactured by connecting transistors, diodes, capacitors, resistors, etc., arranged electrically separate on the semiconductor substrate, via wirings.

The technology for connecting the elements in a high density arrangement is the multi-layered wiring technology, and this multi-layered wiring technology is the important technology in determining performance of the LSI. The parasitic effects of the resistances, the capacitances, etc. in the multi-layered wiring circuit have great influence on the performance of the LSI circuit. Multi-layered wiring circuits currently employ Cu (copper) wiring, which has low resistance, and an interlayer insulating film, which is made of a material having a low dielectric constant, in combination. Manufacturing methods for making such multi-layered circuits currently employ "burying", i.e., the so-called damascene process.

The Cu in the Cu wiring layer readily diffuses into the interlayer insulating film in the annealing step, or the like. If the Cu in the Cu wiring layer diffuses into the interlayer insulating film, disadvantages such as an increase in the leakage current in the interlayer insulating film are brought about. For this reason, the diffusion of Cu from the Cu wiring layer is prevented by forming a Cu diffusion preventing insulating film such as a silicon nitride film, between the Cu wiring layer and the interlayer insulating film.

However, the dielectric constant (e.g., $\in$=5 or so) of an insulating film that can prevent the diffusion of Cu is considerably higher, e.g. $\in$=2.8 or so, than that of a low dielectric constant insulating film. Therefore, even if the major part of the interlayer insulating film is formed by an insulating film having a low dielectric constant, the parasitic capacitance between the Cu wiring layers in the multi-layered wiring is effectively increased because of the intervention of the Cu diffusion preventing insulating film. For instance, if the total film thickness of the interlayer insulating film is fixed at 500 nm, if 100 nm is assigned to the thickness of the Cu diffusion preventing insulating film ($\in$=5 or so) and the remaining thickness is assigned to the insulating film having the low dielectric constant ($\in$=2.8 or so), the effective dielectric constant of the interlayer insulating film is increased up to about 3.05. As a result, the delay in the electric signal that is propagated in the wiring of the multi-layered wiring in the LSI, i.e., the wiring delay, is increased and it is possible that this delay may cause a fatal problem.

Therefore, reduction of the film thickness of the Cu diffusion preventing insulating film has been considered. However, because of the influence of the step of forming the Cu diffusion preventing insulating film on the Cu wiring layer by the plasma CVD method, the later annealing at about 400 to 450 □Ž, etc., Cu projections are readily formed at the surface of the Cu wiring layer. Thus, there is the problem that the Cu will diffuse from these projections.

Further, in the prior art, it is difficult to use the insulating film having a low dielectric constant as the Cu diffusion preventing insulating film. As a result, a method of forming an insulating film that has a low dielectric constant and is able to prevent the diffusion of Cu is highly desired.

SUMMARY OF THE INVENTION

It is an object of the present invention to provide a semiconductor device manufacturing method capable of reducing capacitance between wiring layers of the multi-layered wiring by preventing formation of projections on a Cu wiring layer to thereby reduce film thickness of a Cu diffusion preventing insulating film and by making it possible to use a low dielectric constant insulating film as the Cu diffusion preventing insulating film.

The present invention provides a semiconductor device manufacturing method which comprises the steps of forming a silicon-containing insulating film on a wiring layer made mainly of a copper (Cu) formed over a semiconductor substrate; and exposing the silicon-containing insulating film to an atmosphere or a plasma of a hydrocarbon ($C_xH_y$) gas.

Therefore, a carbon-containing layer can be formed on the surface of the silicon-containing insulating film. The carbon-containing layer has etching resistance against the gaseous or liquid etchant used to etch the silicon-containing insulating film. As a result, not only a barrier against diffusion of copper from the copper wiring layer but also an etching stopper for the etching of the thick interlayer insulating film can be provided on the silicon-containing insulating film by a simple process.

Also, the present invention provides a semiconductor device manufacturing method which comprises the steps of exposing a surface of a copper (Cu) wiring layer formed over a semiconductor substrate to a plasma of a gas selected from the group consisting of an ammonia gas, a mixed gas of nitrogen and hydrogen, a $CF_4$ gas, a $C_2F_6$ gas and a $NF_3$ gas; exposing the surface of the copper (Cu) wiring layer to an atmosphere or a plasma of a gas selected from the group consisting of an ammonia gas, an ethylenediamine gas, a β-diketone gas, a mixed gas consisting of the ammonia gas and a hydrocarbon gas ($C_xH_y$), and a mixed gas consisting of a nitrogen gas and the hydrocarbon gas ($C_xH_y$); and forming a Cu diffusion preventing insulating film on the copper (Cu) wiring layer.

According to the present invention, the natural oxide film on the surface of the Cu wiring layer is removed by exposing the surface of the Cu wiring layer, which is subjected to the annealing process, to the plasma of the ammonia gas, etc., for example, in a non-oxidizing gas atmosphere.

Then, the surface of the Cu wiring layer, from which the natural oxide film has been removed, is exposed to an atmosphere or plasma of the gas selected from the group consisting of ammonia gas, ethylenediamine gas, β-diketone gas, a mixed gas consisting of ammonia gas and the hydrocarbon gas ($C_xH_y$), and a mixed gas consisting of the nitrogen gas and the hydrocarbon gas ($C_xH_y$).

If the surface of the Cu wiring layer is treated with the plasma to remove the natural oxide film, a compound layer (or a bonding layer) in which an element such as N, H, C, or the like contained in these gases is combined with or bonded to Cu is formed on the surface of the Cu wiring layer. If the ethylenediamine gas, the fÀ-diketone gas, or the like is employed, a complex is formed on the surface of the Cu wiring layer.

Then, a Cu diffusion preventing insulating film is formed on the Cu wiring layer that has been subjected to the surface treatment. Since the above-described compound layer is formed on the surface of the Cu wiring layer, the generation of projections at the surface of the Cu wiring layer during forming the Cu diffusion preventing insulating film or during the later annealing can be suppressed. Accordingly, even if the film thickness of the Cu diffusion preventing insulating film is reduced, the diffusion of Cu can be prevented.

In addition, the surface portion (compound layer) of the Cu wiring layer can also function as the Cu diffusion preventing film. Therefore, even if an insulating film with a low dielectric constant and a low Cu diffusion preventing capability is employed as the Cu diffusion preventing insulating film, the diffusion of Cu can be prevented.

As a result, since an increase in the capacitance between the Cu wiring layers can be prevented, the multi-layered wiring for a high-performance LSI having a small wiring delay can be manufactured.

Also, the present invention provides a semiconductor device manufacturing method which comprises the steps of exposing a surface of a copper (Cu) wiring layer formed over a semiconductor substrate to a plasma of an ammonia gas; forming a silicon-containing insulating film on the copper (Cu) wiring layer; and exposing the silicon-containing insulating film to an atmosphere or a plasma of a gas selected from the group consisting of a mixed gas consisting of ammonia and a hydrocarbon($C_xH_y$), a mixed gas consisting of nitrogen and hydrocarbon gas ($C_xH_y$), nitrogen, and ammonia.

According to the present invention, first the natural oxide film on the surface of the Cu wiring layer is removed by exposing the surface of the Cu wiring layer to a plasma of ammonia gas.

Then, the silicon-containing insulating film is formed on this Cu wiring layer. In order to reduce the parasitic capacitance around the Cu wiring, for example, is formed a silicon-containing insulating film whose dielectric constant is relatively low. In this case also, the silicon-containing insulating film used is an insulating film of low Cu diffusion preventing capability.

Then, this Cu diffusion preventing insulating film is exposed to an atmosphere or plasma of the above gas, for example, the gas mixture consisting of ammonia and hydrocarbon ($C_xH_y$) gas.

The foregoing process may be carried out in two steps. More particularly, first the silicon-containing insulating film may be exposed to either an atmosphere or plasma of ammonia or plasma of nitrogen gas, and then exposed to the plasma of the $C_xH_y$ gas. In an opposite sequence of the two steps, first the silicon-containing insulating film may be exposed to the plasma of the hydrocarbon ($C_xH_y$) gas, and then exposed to either the atmosphere or the plasma of ammonia or the plasma of nitrogen.

In this manner, the character of a silicon-containing insulating film can be changed to that of an insulating film having high Cu diffusion preventing capability by exposing the silicon-containing insulating film, having a low dielectric constant and low Cu diffusion preventing capability, to an atmosphere or plasma of one of the above-mentioned gases. Accordingly, an insulating film having a low dielectric constant can be employed as the Cu diffusion preventing insulating film. Therefore, since not only diffusion of Cu from the Cu wiring layer can be prevented but also an increase in the parasitic capacitance around the Cu wiring layer can be prevented, multi-layered wiring for the high-performance LSI having a small wiring delay can be manufactured.

In addition, since the natural oxide film on the surface of the Cu wiring layer is removed by the plasma of the ammonia gas before the silicon-containing insulating film is formed on the Cu wiring layer, the adhesiveness between the Cu wiring layer and the silicon-containing insulating film can be improved. Therefore, the reliability of the multi-layered wiring can be improved.

BRIEF DESCRIPTION OF THE DRAWINGS

FIGS. 2A and 2B are schematic sectional views illustrating steps in a semiconductor device manufacturing method according to a first embodiment of the present invention;

DESCRIPTION OF THE PREFERRED EMBODIMENTS

Embodiments of the present invention will be explained with reference to the accompanying drawings hereinafter.

(Explanation of the semiconductor manufacturing equipment employed in the described embodiments of the semiconductor device manufacturing method)

Figure 1:
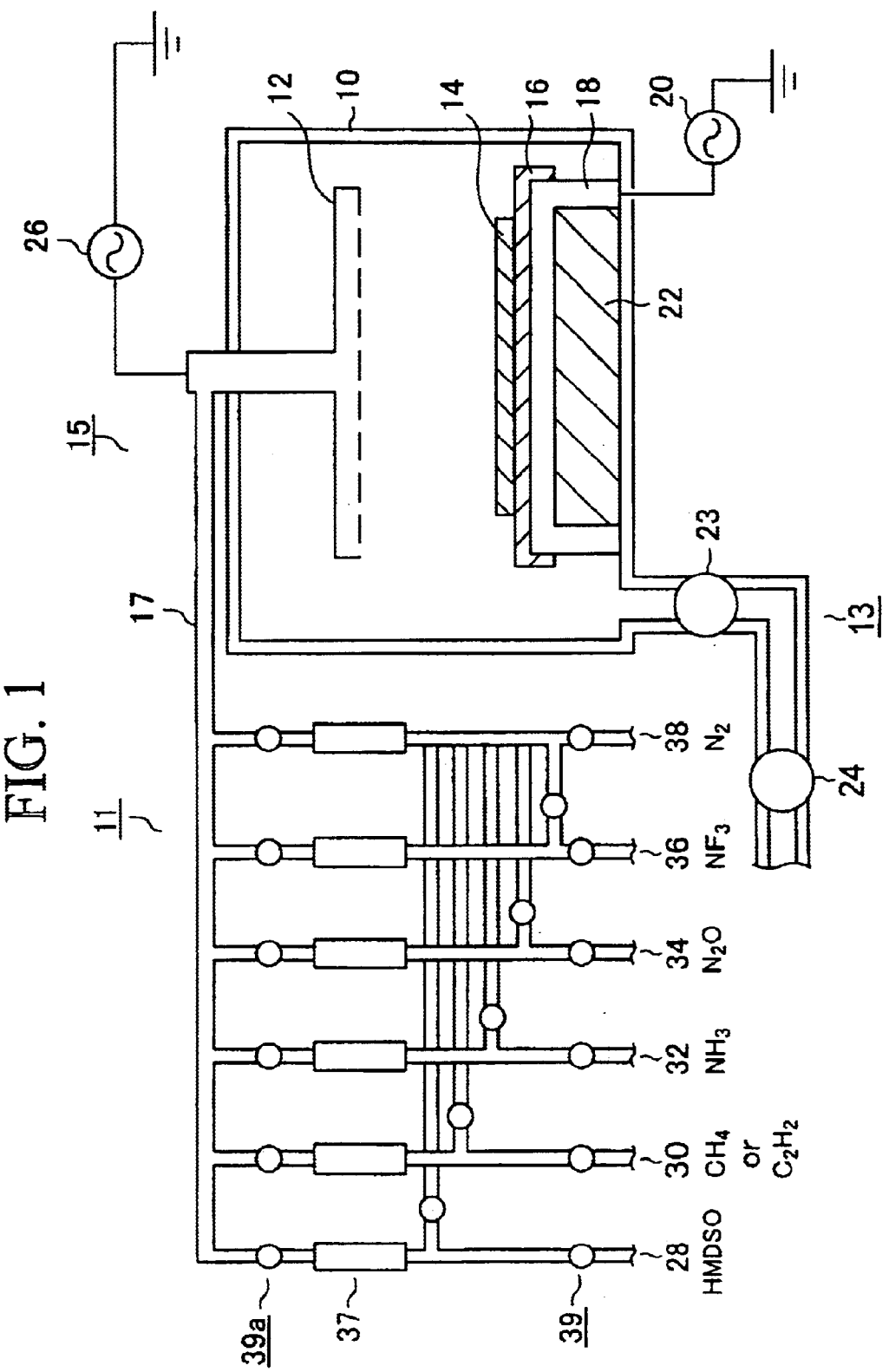
FIG. 1 is a schematic sectional view showing the plasma CVD equipment employed in the semiconductor device manufacturing method according to embodiments of the present invention.

FIG. 1 is a schematic sectional view showing the plasma CVD equipment employed in the embodiments of the present invention.

The semiconductor manufacturing equipment employed in the following embodiments of the semiconductor device manufacturing method according to embodiments is the plasma CVD (Chemical Vapor Deposition) apparatus 15. As shown in FIG. 1, this apparatus 15 comprises basically a chamber 10 in which the film formation and the plasma process are applied to a semiconductor substrate, a gas supply system 11 for supplying the gases to the chamber 10, and a gas exhaust system 13 for reducing the pressure in the chamber 10. Two electrodes, i.e., a lower electrode 18 and an upper electrode 12 are provided in the chamber 10. A heater 22 for heating a semiconductor substrate 14 is arranged under the lower electrode 18. Also, a cylindrical susceptor 16, on which the semiconductor substrate 14 is loaded covers the top and a portion of the sides of the lower electrode 18.

A high-frequency power supply 20 of 380 kHz as LF (Low Frequency) is connected to the lower electrode 18, while a high-frequency power supply 26 of 13.56 MHz as RF (Radio Frequency) is connected to the upper electrode 12. If the high-frequency power is supplied to the gas in the chamber 10 by using any one or both of these high-frequency power supplies 20, 26, the gas can be converted to a plasma.

The upper electrode 12 is also used as a distributor to supply the gas into the chamber 10. A gas supply pipe 17 is connected to this distributor. A HMDSO (($Si(CH_3)_3)_2O$) gas line 28, a $CH_4$ or $C_2H_2$ gas line 30, a $NH_3$ gas line 32, a $N_2O$ gas line 34, a $NF_3$ gas line 36, and a $N_2$ gas line 38 are connected to the gas supply pipe 17. A mass flowmeter 37 and one of gas supply valves 39, 39a are provided in each of these gas lines 28, 30, 32, 34, 36, 38.

The $N_2$ gas line 38 is connected to the massflow meter 37 and a gas supply valve 39 are provided in each of gas lines 28, 30, 32, 34, 36. Accordingly, the $N_2$ gas can be supplied to the remaining gas lines 28, 30, 32, 34, 36 as a purge.

The above gas lines are shown merely as an example. Of course, such gas lines can be appropriately varied to supply a desired gas. An exhaust valve 23 and an exhaust pump 24 are provided in the gas exhaust system 13 connected to the chamber 10.

The plasma CVD apparatus 15 is employed in the present embodiment as follows. First, while reducing the pressure in the chamber 10 by the gas exhaust system 13, the appropriate gas is supplied from the gas supply pipe 17 to the chamber 10 to bring the chamber 10 to a predetermined pressure. Then, the gas is converted to a plasma by applying the high-frequency voltage to the lower electrode 18 and the upper electrode 12. With the gas converted to a plasma in this manner, formation of various films and the plasma process can be applied to the semiconductor substrate. Of course, the semiconductor substrate can also be processed in a gas atmosphere not converted to a plasma.

1. First Embodiment

FIGS. 2A and 2B are schematic sectional views illustrating steps in a semiconductor device manufacturing method according to a first embodiment of the present invention.

In the semiconductor device manufacturing method according to the first embodiment of the present invention, first a semiconductor substrate 40 as shown in FIG. 2A is prepared. That is, semiconductor elements (not shown) are formed on the semiconductor substrate 40, and Cu (copper) wiring layers 44, each buried in a wiring recess 42a in an insulating film 42, are formed over the semiconductor substrate 40 such that the semiconductor elements are electrically connected to the Cu wiring layer 44.

The Cu wiring layer 44 is buried in the wiring recess 42a via a barrier layer 44a of TiN, TaN, or the like, for example. The barrier layer 44a and the Cu wiring layer 44 are buried in the wiring recess 42a, with removal of the films which are formed in the wiring recess 42a and on the insulating film 42, from the surface by chemical mechanical polishing (CMP). After the film of the Cu wiring layer 44 is formed or the Cu wiring layer 44 is buried by the CMP method, annealing is applied to this Cu wiring layer 44 in a non-oxidizing gas (e.g., hydrogen gas) atmosphere.

Then, the semiconductor substrate 40 is placed in the chamber 10 of the above plasma CVD apparatus 15. Then, a surface of the Cu wiring layer 44 on the semiconductor substrate 40 is exposed to the plasma of $NH_3$ (ammonia) gas, the plasma of the mixed gas consisting of $N_2$ (nitrogen) and $H_2$ (hydrogen), the plasma of the $CF_4$ gas, the plasma of the $C_2F_6$ gas, or the plasma of the $NF_3$ gas. The natural oxide film formed on a surface of the Cu wiring layer 44 is thereby removed.

Then, the surface of the Cu wiring layer 44 is exposed to the atmosphere or the plasma of the gas containing $NH_3$ (ammonia), the $C_xH_y$ (hydrocarbon), or the like, for example, in the same chamber 10 or in another chamber of the same apparatus. Accordingly, as shown in FIG. 2B, a compound layer (or a bonding layer) 44b is formed at the surface portion of the Cu wiring layer 44 by elements such as N, H, C, or the like in the above gas combining with or bonding to Cu at the surface of the Cu wiring layer 44.

Gases suitable for use in this step include $NH_3$ (ammonia), ethylenediamine, fÀ-diketone, a mixed gas of $NH_3$ (ammonia) and $C_xH_y$ (hydrocarbon), a mixed gas of $N_2$ (nitrogen) and $C_xH_y$(hydrocarbon), and the like. The $C_xH_y$ gas may be any one of $CH_4$ (methane), $C_2H_2$ (acetylene), $C_2H_4$ (ethylene), $C_3H_8$ (propane), $C_4H_8$ (butylene), $C_4H_{10}$ (butane), $C_6H_6$ (benzene), $C_6H_{12}$ (cyclohexane) and $C_7H_{14}$ (methylcyclohexane).

If ethylenediamine, fÀ-diketone, or the like is employed, the complex is formed on the surface of the Cu wiring layer 44. As an example of a fÀ-diketone gas, hexafluoroacetylacetone ($C_5H_2O_2F_6$) may be employed.

Then, a Cu diffusion preventing insulating film 46 of silicon nitride film or the like is formed on the Cu wiring layer 44, which has been subjected to the surface treatment, by the plasma CVD method. At this time, since the compound layer 44b is formed on the surface of the Cu wiring layer 44, the formation of Cu projections on the surface of the Cu wiring layer 44 can be suppressed.

Accordingly, even if the film thickness of the Cu diffusion preventing insulating film 46 is reduced, Cu diffusion can be prevented.

Also, in the later annealing step, the compound layer 44b formed on the surface of the Cu wiring layer 44 can suppress the formation of projections on the surface of the Cu wiring layer 44.

In addition, the compound layer 44b formed on the surface of the Cu wiring 44 also functions as a Cu diffusion preventing film. Therefore, even if an insulating film with a low dielectric constant and poor Cu diffusion preventing capability, e.g., a silicon-containing insulating film having a dielectric constant of about 4, is employed as the Cu diffusion preventing insulating film, the Cu diffusion can be prevented.

As a result, since capacitance between the Cu wiring layers 44 can be reduced, the multi-layered wiring for a high-performance LSI having a small wiring delay can be manufactured.

(1) First Example

In a first example of the semiconductor device manufacturing method according to the first embodiment, the surface of the Cu wiring layers 44 on the semiconductor substrate 40 is first treated in two steps, using the above-described plasma CVD apparatus 15.

(First Step)

$NH_3$ flow rate . . . 500 sccm

Pressure . . . 1 Torr

Temperature of the susceptor 16 (semiconductor substrate 40) . . . 375 □Ž

Power of the high-frequency power supply 26 of 13.56 MHz . . . 100 W

Process time . . . 10 seconds

In the first step, the natural oxide film formed on the surface of the Cu wiring layer 44 is removed.

(Second Step)

$NH_3$ flow rate . . . 500 sccm

Pressure . . . 1 Torr

Process time . . . 60 seconds

Then, the silicon-containing insulating film 46 (Cu diffusion preventing insulating film) of a thickness of 100 nm is formed in the same chamber of the plasma CVD apparatus 15 or in another chamber under the following film forming conditions, as an example.

HMDSO flow rate . . . 50 sccm $N_2O$ flow rate . . . 100 sccm $NH_3$ flow rate . . . 200 sccm Pressure . . . 1 Torr Power of the high-frequency power supply 20 of 380 kHz . . . 150 W (2) Second Example In a second example of the semiconductor device manufacturing method according to the first embodiment, the surface of the Cu wiring layers 44 on the semiconductor substrate 40 is first treated in two steps, using the above-described plasma CVD apparatus 15.

(First Step)

The natural oxide film formed on the surface of the Cu wiring layer 44 is removed under the same conditions as used in the first example.

(Second Step)

$NH_3$ flow rate . . . 200 sccm $CH_4$ flow rate . . . 200 sccm

Pressure . . . 1 Torr

Power of the high-frequency power supply 26 of 13.56 MHz . . . 100 W

Process time . . . 30 seconds

Then, the silicon-containing insulating film 46 (Cu diffusion preventing insulating film) of a thickness of 100 nm is formed by the same method as used in the first example.

(3) Third Example

In a third example of the semiconductor device manufacturing method according to the first embodiment, the surface of the Cu wiring layer 44 on the semiconductor substrate 40 is first treated in two steps, as described in the following, using the above-described plasma CVD apparatus 15.

(First Step)

The natural oxide film formed on the surface of the Cu wiring layer 44 is removed under the same conditions as used in the first example.

(Second Step)

Ethylenediamine flow rate . . . 200 sccm

Pressure . . . 1 Torr

Process time . . . 60 seconds

Then, the silicon-containing insulating film 46 (Cu diffusion preventing insulating film) of a thickness of 100 nm is formed by the same method as used in the first example.

(4) Fourth Example

A fourth example of the semiconductor device manufacturing method according to the first embodiment will now be described. First, the surface of the Cu wiring layer 44 on the semiconductor substrate 40 is treated in two steps, as described in the following, using the above-described plasma CVD apparatus 15.

(First Step)

The natural oxide film formed on the surface of the Cu wiring layer 44 is removed under the same conditions as used in the first example.

(Second Step)

Ethylenediamine flow rate . . . 200 sccm

Pressure . . . 1 Torr

Power of the high-frequency power supply 26 of 13.56 MHz . . . 100 W

Process time . . . 30 seconds

Then, the silicon-containing insulating film 46 (Cu diffusion preventing insulating film) of a thickness of 100 nm is formed by the same method as used in the first example.

(5) Fifth Example

In a fifth example of the semiconductor device manufacturing method according to the first embodiment, the surface of the Cu wiring layer 44 on the semiconductor substrate 40 is treated in two steps, described in the following, using the above-described plasma CVD apparatus 15.

(First Step)

The natural oxide film formed on the surface of the Cu wiring layer 44 is removed under the same conditions as used in the first example.

(Second Step)

Ethylenediamine flow rate . . . 200 sccm

Pressure . . . 1 Torr

Power of the high-frequency power supply 26 of 13.56 MHz . . . 100 W

Process time . . . 30 seconds

Then, the silicon-containing insulating film 46 (Cu diffusion preventing insulating film) of a thickness of 100 nm is formed by the same method as used in the first example.

(Post-process)

Then, as the post-treatment process, the surface of the silicon-containing insulating film 46 (Cu diffusion preventing insulating film) is treated under the following conditions.

Ethylenediamine flow rate . . . 200 sccm

Pressure . . . 1 Torr

Process time . . . 60 seconds (6) Sixth Example

In a sixth example of the semiconductor device manufacturing method according to the first embodiment, the surface of the Cu wiring layers 44 on the semiconductor substrate 40 is first treated in two steps, using the above-described plasma CVD apparatus 15.

(First Step)

The natural oxide film formed on the surface of the Cu wiring layer 44 is removed under the same conditions as used in the first example.

(Second Step)

Ethylenediamine flow rate . . . 200 sccm

Pressure . . . 1 Torr

Power of the high-frequency power supply 26 of 13.56 MHz . . . 100 W

Process time . . . 30 seconds

Then, the silicon-containing insulating film 46 (Cu diffusion preventing insulating film) of a thickness of 100 nm, for example, is formed by the same method as used in the first example.

(Post-process)

Then, the surface of the silicon-containing insulating film 46 (Cu diffusion preventing insulating film) is treated under following conditions.

Ethylenediamine flow rate . . . 200 sccm

Pressure . . . 1 Torr

Power of the high-frequency power supply 26 of 13.56 MHz . . . 100 W

Process time . . . 60 seconds

Like the fifth example and the sixth example, if the surface of the silicon-containing insulating film 46 is exposed to the atmosphere or the plasma of the ethylenediamine gas, the Cu diffusion can be prevented to a greater extent.

(Evaluation Tests)

(1) Formation of the Reference Sample

A reference sample is formed, without treating the surface of the Cu wiring layer 44 on the semiconductor substrate 40, by forming the silicon-containing insulating film 46 (Cu diffusion preventing insulating film) directly on the Cu wiring layer 44. The silicon-containing insulating film 46 thus employed had such poor Cu-diffusion preventing capability that the Cu in the Cu wiring layer 44 readily diffused when this film is annealed at 450 □Ž for four hours, for example. Only HMDSO was used as the film forming gas.

HMDSO flow rate . . . 50 sccm

Pressure . . . 1 Torr

Power of the high-frequency power supply 20 of 380 kHz. . . 150 W (2) Formation of the Test Sample Then, the test sample is formed by the following method.

First, the natural oxide film on the surface is removed by exposing the surface of the Cu wiring layer 44 on the semiconductor substrate 40 to a $NH_3$ plasma while using the above plasma CVD apparatus 15. Then, the surface of the Cu wiring layer 44 is treated by the RF plasma (the pressure: 2.0 Torr) of the mixed gas consisting of $NH_3$ and $C_7H_{14}$ (methylcyclohexane). Then, the silicon-containing insulating film 46 is formed on the Cu wiring layer 44 under conditions identical to the film forming conditions used to form the above reference sample.

(3) Test Method and Test Results

First, for both the reference sample and the test sample, the current (I)-voltage (V) characteristic of the silicon-containing insulating film 46 (Cu diffusion preventing insulating film) was checked by the Hg-probe method. Then, after the reference sample and the test sample were annealed at 450 □Ž for four hours, the current (I)-voltage (V) characteristic of the silicon-containing insulating film 46 was checked once again by the Hg-probe method.

Figure 3:
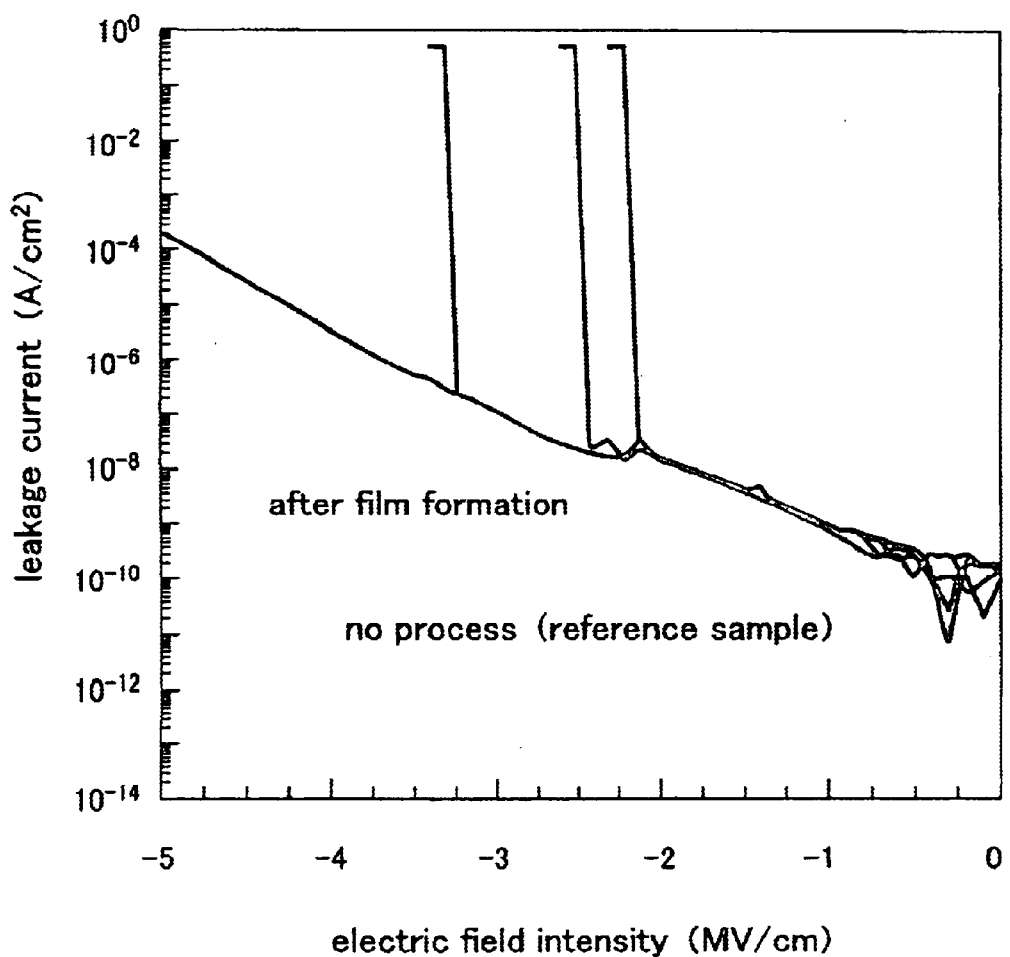
FIG. 3 is a graph showing a current (I)-voltage (V) characteristic of a reference sample prior to annealing.
Figure 4:
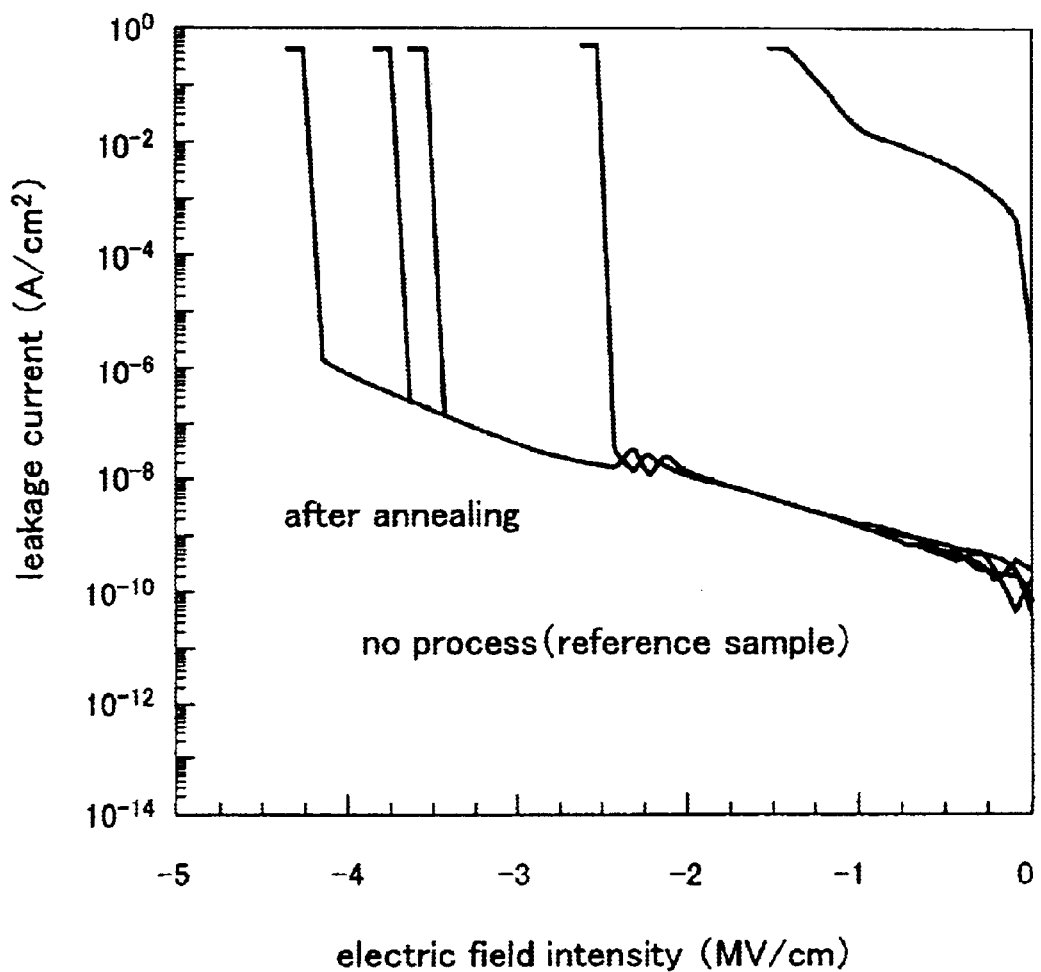
FIG. 4 is a graph showing a current (I)-voltage (V) characteristic of the reference sample after annealing.
Figure 5:
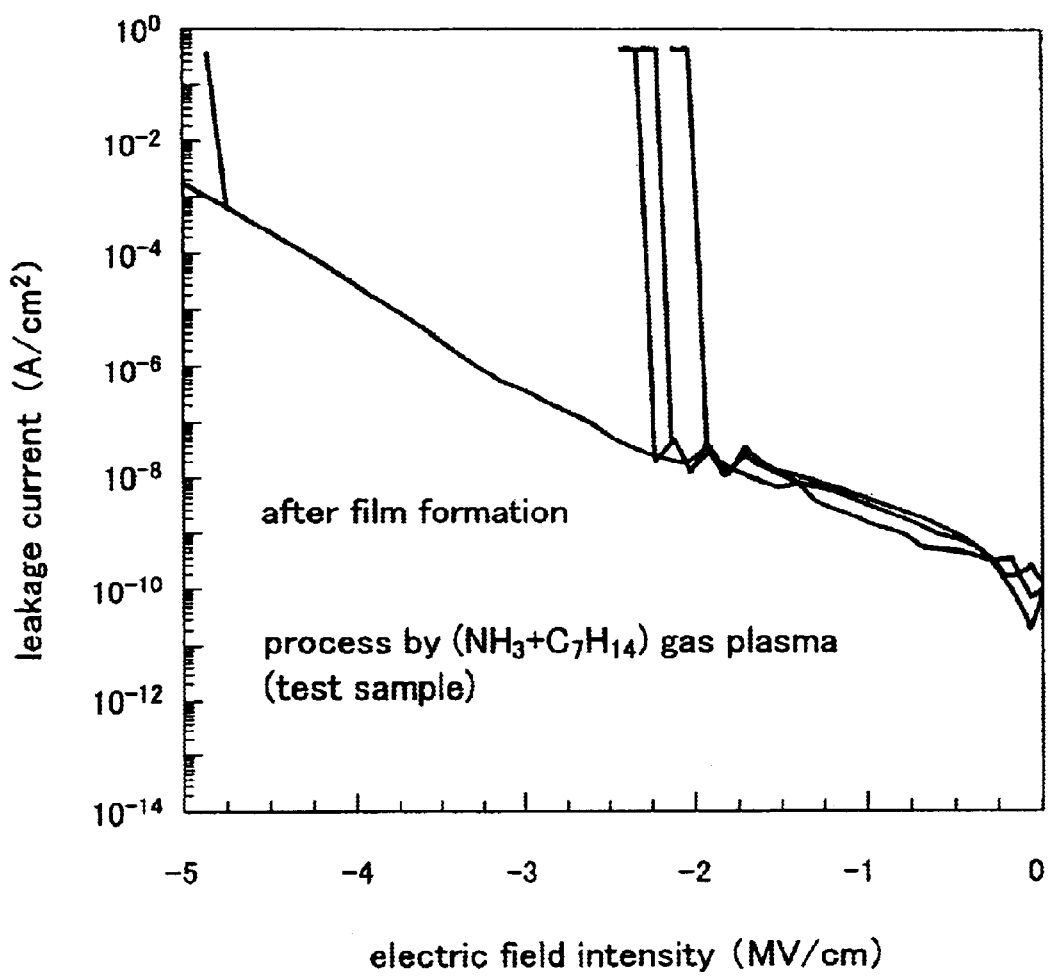
FIG. 5 is a graph showing a current (I)-voltage (V) characteristic of a test sample (processed by an $NH_3+C_7H_{14}$ gas plasma) according to the first embodiment of the present invention, prior to annealing.
Figure 6:
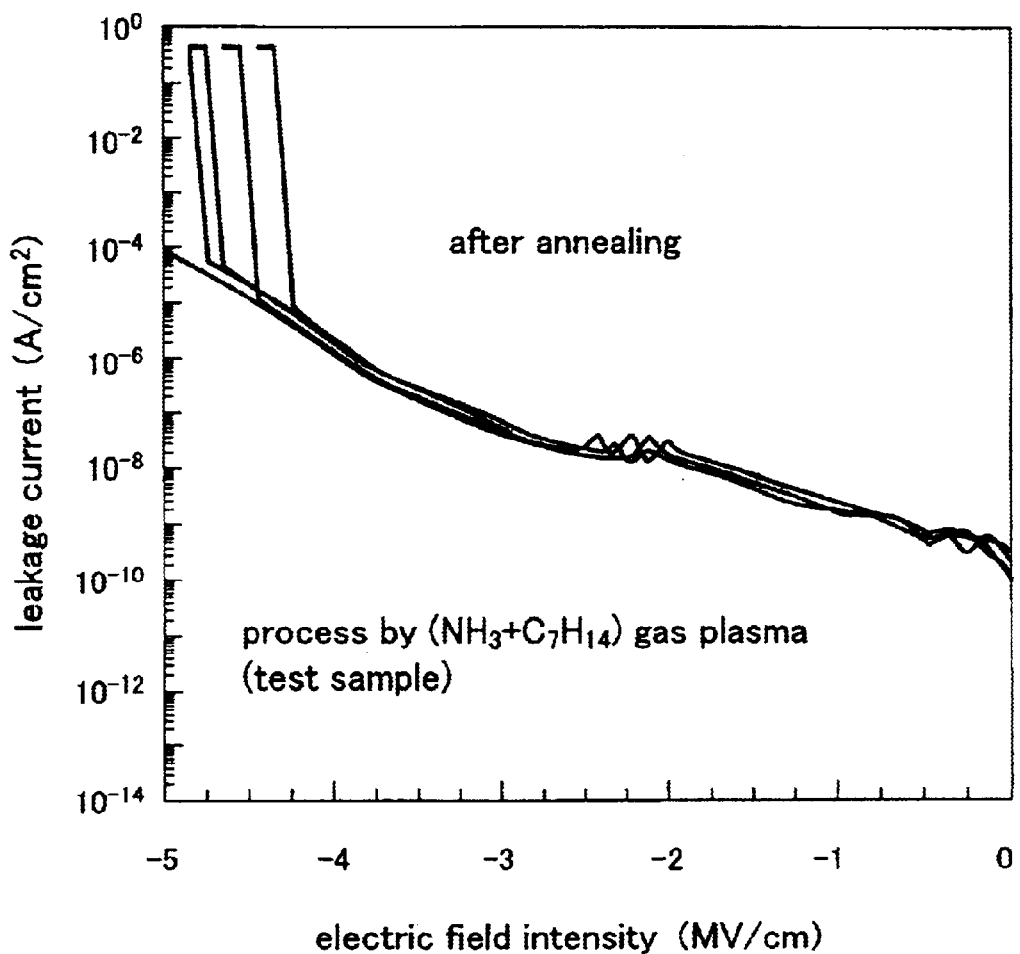
FIG. 6 is a graph showing a current (I)-voltage (V) characteristic of the test sample (processed by the $NH_3+C_7H_{14}$ gas plasma) according to the first embodiment of the present invention after annealing.

FIG. 3 shows the current (I)-voltage (V) characteristic of the reference sample prior to the annealing, FIG. 4 shows the current (I)-voltage (V) characteristic of the reference sample after the annealing, FIG. 5 shows the current (I)-voltage (V) characteristic of the test sample prior to the annealing, and FIG. 6 shows a current (I)-voltage (V) characteristic of the test sample after the annealing. The abscissa of these graphs denotes the electric field intensity (MV/cm) and the ordinate denotes the leakage current ($A/cm^2$).

According to the I-V characteristic after the silicon-containing insulating film 46 of the reference sample (prior to the annealing), as shown in FIG. 3, the film had a predetermined dielectric breakdown voltage, although such voltage varied slightly as between different locations in the semiconductor substrate. Then, after the reference sample was annealed at 450 □Ž for four hours, leakage current flowed through the silicon-containing insulating film 46 at the low electric field intensity, in accordance with the location in the semiconductor substrate, as apparent from a comparison between FIG. 3 and FIG. 4. Thus, it was confirmed that there is a tendency for the dielectric breakdown voltage to be lowered by the annealing.

In other words, if the process of the present invention is not applied to the surface of the Cu wiring layer 44, the Cu in the Cu wiring layer 44 can readily diffuse into the Cu diffusion preventing insulating film 46 (silicon-containing insulating film) whose Cu diffusion preventing capability has been lowered by the annealing.

In the test sample, the surface of the Cu wiring layer 44 was subjected to the RF plasma process (13.56 MHz) using the mixed gas consisting of $NH_3$ gas+$C_7H_{14}$ (methylcyclohexane) gas. As apparent from a comparison between FIG. 5 and FIG. 6, no reduction in the dielectric breakdown voltage of the silicon-containing insulating film 46 appeared even after annealing. Thus, it was confirmed that such dielectric breakdown voltage is equivalent to or more than that obtained prior to the annealing.

As described above, it was confirmed that, if the surface of the Cu wiring layer 44 is treated using the semiconductor device manufacturing method according to the present embodiment, the dielectric breakdown voltage of the silicon-containing insulating film 46 (Cu diffusion preventing insulating film) on the Cu wiring layer 44, after annealing, is at least equivalent to the voltage obtained before the annealing based on the current (I)-voltage (V) characteristic, and thus diffusion of Cu from the Cu wiring layer 44 into the silicon-containing insulating film 46 can be prevented.

2. Second Embodiment

Figure 7A:
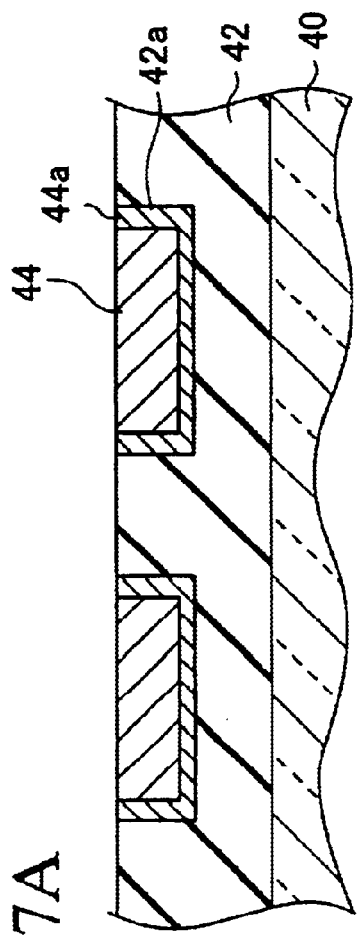
FIGS. 7A and 7B are schematic sectional views illustrating steps in a semiconductor device manufacturing method according to a second embodiment of the present invention.
Figure 7B:
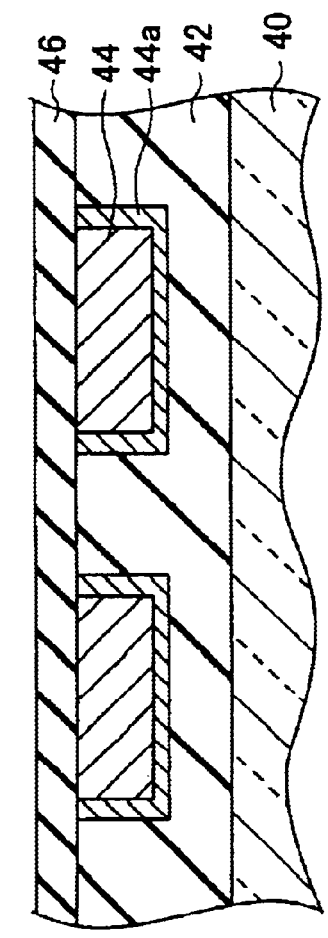

FIGS. 7A and 7B are schematic sectional views showing a semiconductor device manufacturing method according to a second embodiment of the present invention.

In the semiconductor device manufacturing method according to the second embodiment, since the natural oxide film formed on the surface of the Cu wiring layer is removed, then the silicon-containing insulating film whose dielectric constant is relatively low is formed on the Cu wiring layer, and then the process is applied to this silicon-containing insulating film, the silicon-containing insulating film can be changed into a Cu diffusion preventing insulating film, whose Cu diffusion preventing capability is high, to prevent the diffusion of Cu.

In the semiconductor-device manufacturing method according to the second embodiment, first the semiconductor substrate 40 having the Cu wiring layer 44, as shown in FIG. 7A, like the first embodiment, is prepared.

Then, the semiconductor substrate 40 is placed in the chamber 10 of the above-described plasma CVD apparatus, and then the natural oxide film on the surface of the Cu wiring layer 44 is removed by exposing that surface to the plasma of the $NH_3$ (ammonia) gas.

Then, as shown in FIG. 7B, a silicon-containing insulating film 46a is formed on the Cu wiring layer 44, from the surface of which the natural oxide film has been removed, in the same chamber 10 or in another chamber of the same apparatus. If the silicon-containing insulating film 46a is formed from a reaction gas containing HMDSO, or the like, a film having a dielectric constant of about 3.5 to 4 can be formed. This silicon-containing insulating film 46a has a low Cu diffusion preventing capability. As the silicon-containing insulating film 46a, a silicon nitride film, a silicon oxide film, a silicon oxide nitride film, etc. may be employed.

Then, the silicon-containing insulating film 46a is exposed to the atmosphere or the plasma of the mixed gas consisting of $NH_3$ (ammonia) and $C_xH_y$ (hydrocarbon), of the mixed gas consisting of $N_2$ (nitrogen) gas and $C_xH_y$ (hydrocarbon) gas, the plasma of the $N_2$ (nitrogen) gas, or the atmosphere of the $NH_3$ (ammonia) gas in the same chamber 10 or in another chamber of the same apparatus.

In using a plasma of the mixed gas consisting of $NH_3$ and $C_xH_y$, a plasma of the mixed gas consisting of $N_2$ and $C_xH_y$ gas, and a plasma of $N_2$, it is preferable that the RF plasma at 13.56 MHz or the LF plasma at 380 kHz is employed.

The above plasma treatment may be carried out in two steps. More specifically, first the silicon-containing insulating film 46 may be exposed to either an atmosphere or a plasma of the $NH_3$ or $N_2$, and then such film may be exposed to the atmosphere or the plasma of the $C_xH_y$ gas. The opposite sequence may also be employed, wherein the silicon-containing insulating film 46 is first exposed to an atmosphere or a plasma of the $C_xH_y$ gas, and then exposed to either the atmosphere or the plasma of $NH_3$ or $N_2$.

The same hydrocarbon gases as mentioned in connection with the first embodiment can be employed as the $C_xH_y$ gas.

In this manner, the character of the silicon-containing insulating film 46a is changed by the above treatment of the silicon-containing insulating film 46, and thus this treated film 46a can function as the Cu diffusion preventing insulating film for preventing the diffusion of Cu. In other words, a silicon-containing insulating film 46a which has a low dielectric constant can be employed as the Cu diffusion preventing insulating film. Accordingly, since the parasitic capacitance around the Cu wiring of the multi-layered wiring is less, a multi-layered wiring structure for a high-performance LSI having a small wiring delay can be manufactured.

Also, since the natural oxide film on the surface of the Cu wiring layer 44 is removed by the plasma of $NH_3$ and then the silicon-containing insulating film 46a is formed on the Cu wiring layer 44, the adhesiveness between the Cu wiring layer 44 and the silicon-containing insulating film 46a can be improved. Therefore, the reliability of the multi-layered wiring can be improved.

(1) First Example

In a first example of the semiconductor device manufacturing method according to the second embodiment, the semiconductor substrate 40 is first placed in the chamber 10 of the above-described plasma CVD apparatus, and then the natural oxide film on the surface layer portion of the Cu wiring layer 44 is removed under the following conditions.

$NH_3$ flow rate . . . 500 sccm

Pressure . . . 1 Torr

Temperature of the susceptor 16 (semiconductor substrate 40). . . 375 □Ž

Power of the high-frequency power supply 26 at 13.56 MHz . . . 100 W

Process time . . . 10 seconds

In turn, the silicon-containing insulating film 46a of a thickness of 100 nm, for example, is formed under following film-forming conditions, as an example, in the same chamber 10 or another chamber.

HMDSO flow rate . . . 50 sccm $N_2O$ flow rate . . . 100 sccm $NH_3$ flow rate . . . 200 sccm Pressure . . . 1 Torr Power of the high-frequency power supply 20 at 380 kHz . . . 150 W Subsequently, the silicon-containing insulating film 46a is processed under following conditions.

$NH_3$ flow rate . . . 200 sccm

Pressure . . . 1 Torr

Power of the high-frequency power supply 26 at 13.56 MHz . . . not applied (0 W)

Process time . . . 60 seconds (2) Second Example

In a second example of the semiconductor device manufacturing method according to the second embodiment the natural oxide film on the surface of the Cu wiring layer 44 is removed by the same method as used in the first example. Then, the silicon-containing insulating film 46a of a thickness of 100 nm is formed on the thus treated surface.

Then, this silicon-containing insulating film 46a is processed under following conditions.

$NH_3$ flow rate . . . 500 sccm

Pressure . . . 1 Torr

Power of the high-frequency power supply 20 at 380 kHz . . . 100 W

Process time . . . 60 seconds (3) Third Example

In a third example of the semiconductor device manufacturing method according to the second embodiment, the natural oxide film on the surface of the Cu wiring layer 44 is first removed by the same method used in as the first example, and then the silicon-containing insulating film 46a is formed to a thickness of 100 nm.

Then, the silicon-containing insulating film 46a is processed under following conditions.

$NH_3$ flow rate . . . 200 sccm $CH_4$ flow rate . . . 200 sccm

Pressure . . . 1 Torr

Power of the high-frequency power supply 26 at 13.56 MHz . . . 100 W

Process time . . . 60 seconds (4) Fourth Example

In a fourth example of the semiconductor device manufacturing method according to the second embodiment, the natural oxide film on the surface of the Cu wiring layer 44 is first removed by the same method as used in the first example, and then the silicon-containing insulating film 46a is formed to a thickness of 100 nm.

Then, the silicon-containing insulating film 46a is processed in two steps as follows.

(First Step)

$NH_3$ flow rate . . . 500 sccm

Pressure . . . 1 Torr

Power of the high-frequency power supply 26 at 13.56 MHz . . . 100 W

Process time . . . 30 seconds (Second Step)

CH$_4$ flow rate... 500 sccm

Pressure... 1 Torr

Power of the high-frequency power supply 26 at 13.56 MHz... 100 W

Process time... 30 seconds (Evaluation Tests)

Test samples 1A, 2A were formed in accordance with the manufacturing methods used in the first and fourth examples of the second embodiment, respectively, and then the current (I)-voltage (V) characteristic of the silicon-containing insulating film 46a was checked by the same method as that used in the evaluation testing of the first embodiment.

Figure 8:
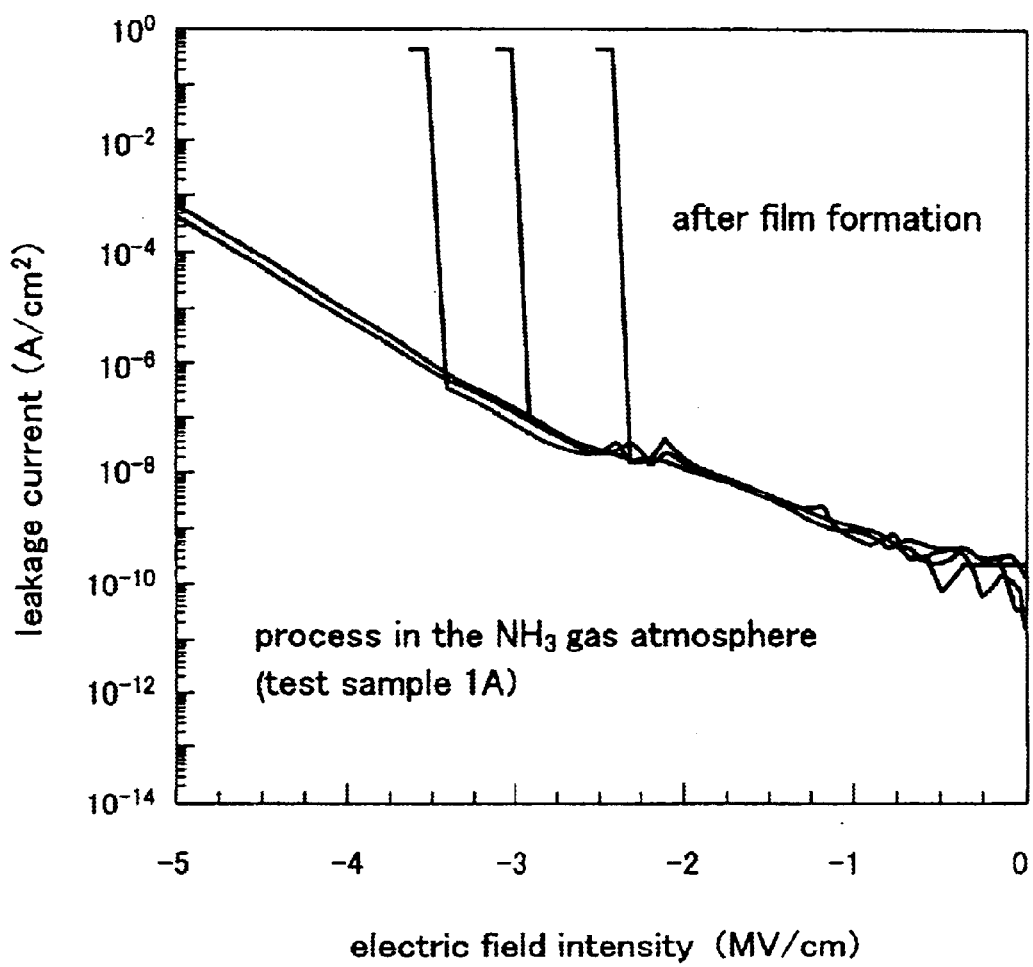
FIG. 8 is a graph showing a current (I)-voltage (V) characteristic of a test sample 1A (processed in an $NH_3$ gas atmosphere) according to the second embodiment of the present invention prior to annealing.
Figure 9:
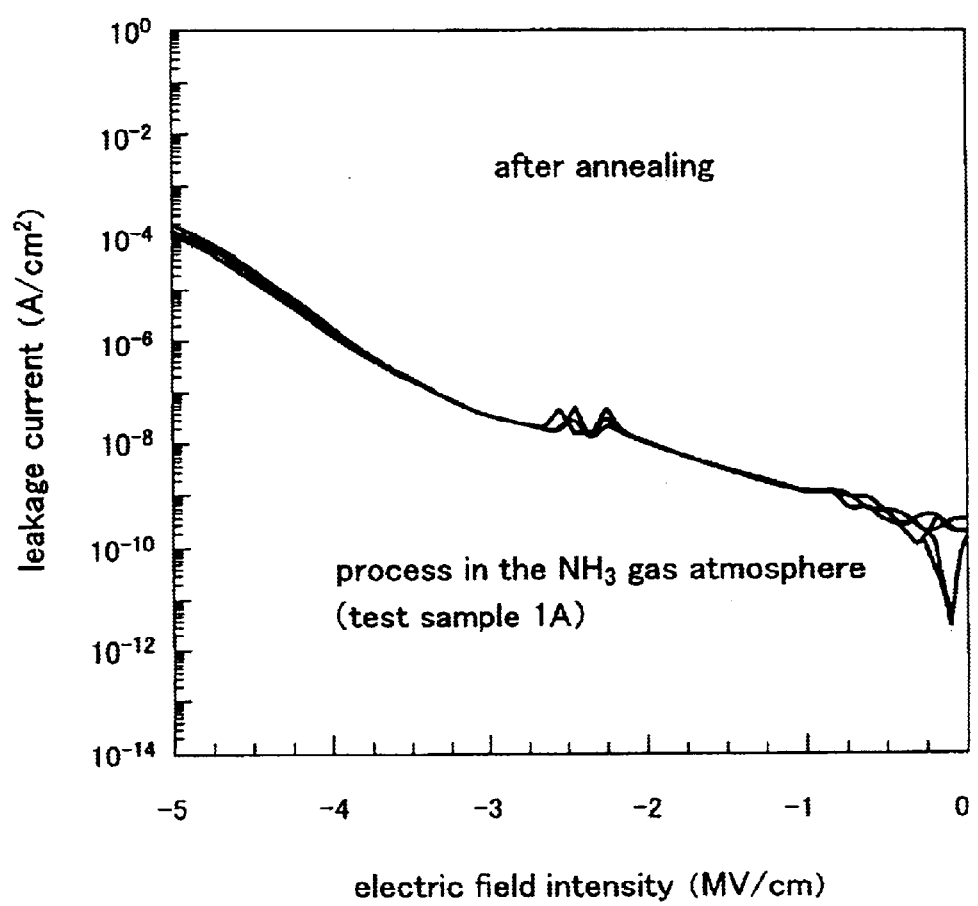
FIG. 9 is a graph showing a current (I)-voltage (V) characteristic of the test sample 1A (processed in the $NH_3$ gas atmosphere) according to the second embodiment of the present invention, after annealing.
Figure 10:
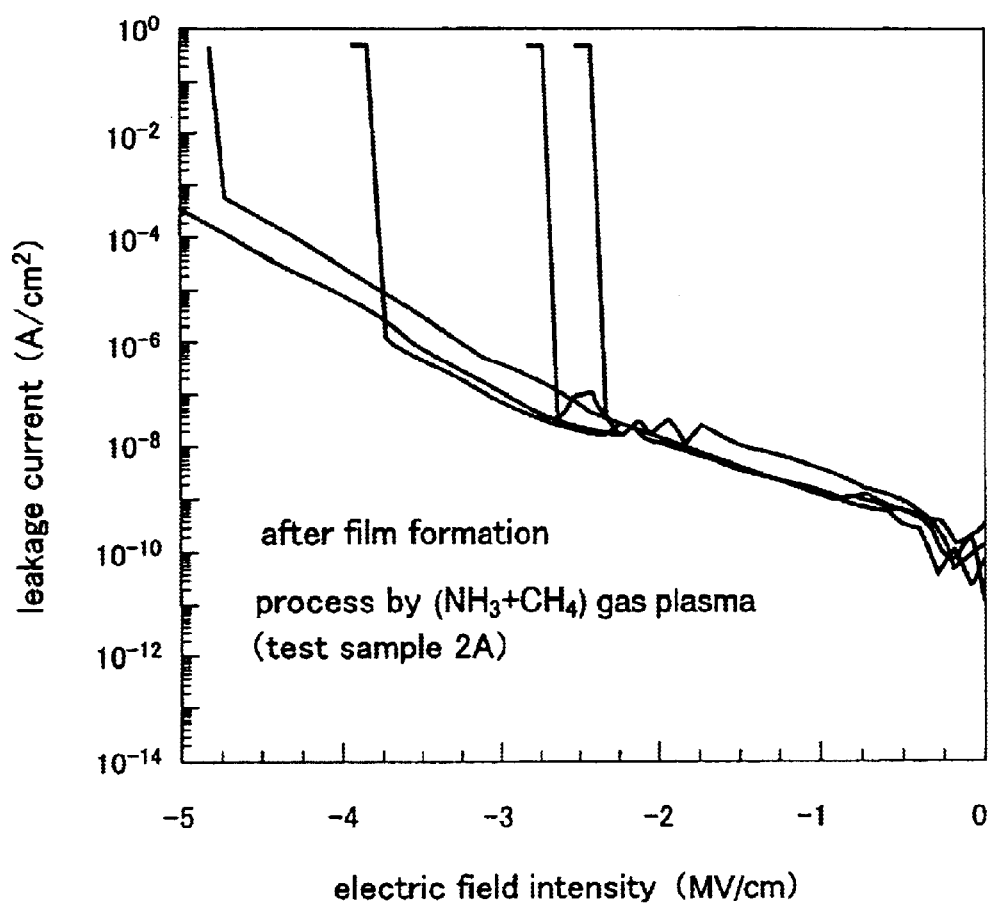
FIG. 10 is a graph showing a current (I)-voltage (V) characteristic of a test sample 2A ($NH_3+CH_4$ gas plasma process) according to the second embodiment of the present invention prior to annealing.
Figure 11:
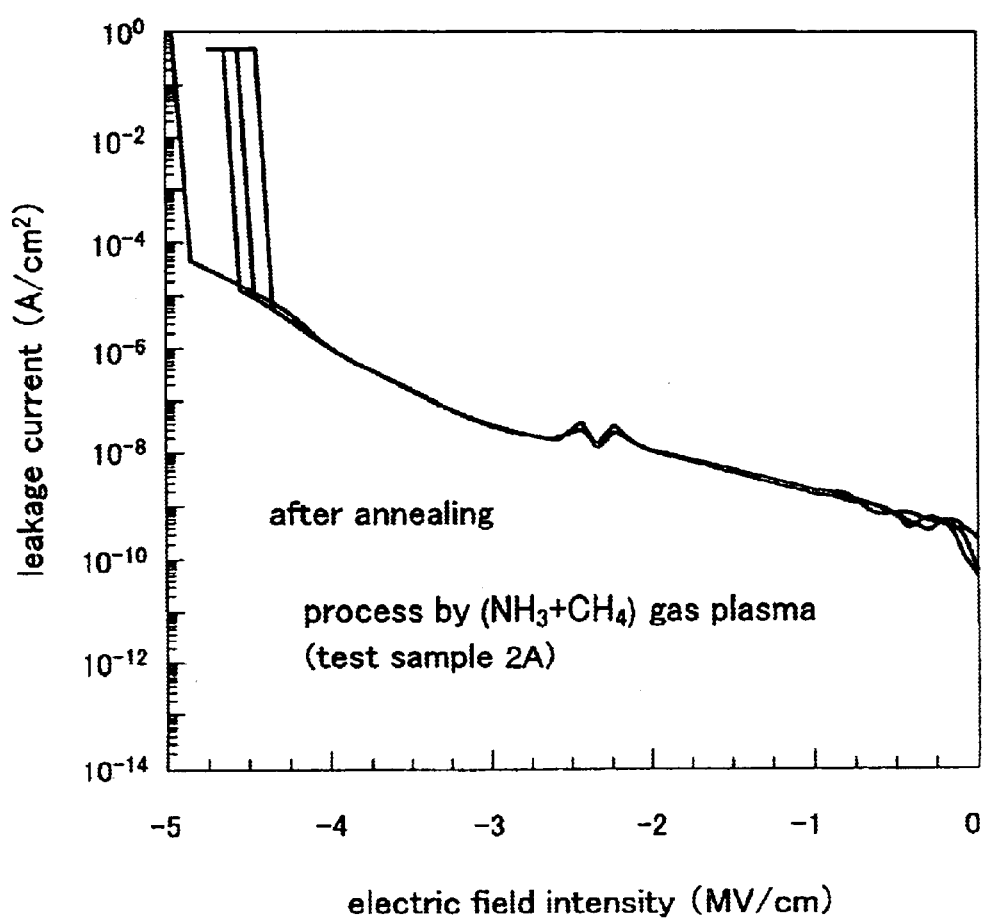
FIG. 11 is a graph showing a current (I)-voltage (V) characteristic of the test sample 2A ($NH_3+CH_4$ gas plasma process) according to the second embodiment of the present invention after annealing.

FIG. 8 shows a current (I)-voltage (V) characteristic of a test sample 1A prior to annealing, FIG. 9 shows a current (I)-voltage (V) characteristic of the test sample 1A after annealing, FIG. 10 shows a current (I)-voltage (V) characteristic of a test sample 2A prior to annealing, and FIG. 11 shows a current (I)-voltage (V) characteristic of the test sample 2A after annealing.

According to the current (I)-voltage (V) characteristic of the silicon-containing insulating film 46a of the test sample 1A (the silicon-containing insulating film 46a processed in a NH$_3$ gas atmosphere (pressure: 0.5 Torr)), as apparent from a comparison between FIG. 8 and FIG. 9, no deterioration in the dielectric breakdown voltage of the silicon-containing insulating film 46a appeared even after annealing. Thus, it was confirmed that the dielectric breakdown voltage is at least equivalent to that prior to the annealing.

Also, in the current (I)-voltage (V) characteristic of the silicon-containing insulating film 46a of the test sample 2A (the silicon-containing insulating film 46a processed using the mixed gas consisting of NH$_3$ and CH$_4$ (pressure: 4 Torr)), as apparent from a comparison between FIG. 10 and FIG. 11, no deterioration of the dielectric breakdown voltage of the silicon-containing insulating film 46a appeared even after annealing. Thus, it was confirmed that the dielectric breakdown voltage is at least equivalent to that prior to the annealing.

These test results mean that the silicon-containing insulating film 46a can prevent diffusion of Cu from the Cu wiring layer 44. In this manner, it was confirmed that, if the silicon-containing insulating film 46a is exposed to the NH$_3$ gas atmosphere or is processed by the plasma of the mixed gas consisting of NH$_3$ and CH$_4$ by using the manufacturing method in the second embodiment, the silicon-containing insulating film 46a can have a high Cu diffusion preventing function.

3. Third Embodiment

In the above second embodiment, a two-step process consisting of the ammonia treatment and the C$_x$H$_y$ treatment is applied to the silicon-containing insulating film 46 on the copper wiring layer 44. Alternatively, as shown in FIG. 12B, a one-step process in which the silicon-containing insulating film 46 on the copper wiring layer 44 is exposed to an atmosphere or plasma of the hydrocarbon (C$_x$H$_y$) gas may be employed.

For instance, a carbon-containing layer 46b of about 5 nm thickness is formed by executing the process under following conditions.

C$_2$H$_2$ flow rate... 50 sccm

Pressure... 0.5 Torr

Power of the high-frequency power supply 26 at 13.56 MHz... 0 W

Power of the high-frequency power supply 20 at 380 kHz... 150 W

Substrate temperature... 375 □Ž

This carbon-containing layer 46b serves as a barrier against diffusion of the copper from the copper wiring layer 44 and has sufficient etching resistance against the gaseous or liquid etchant for the silicon-containing insulating film.

Figure 12A:
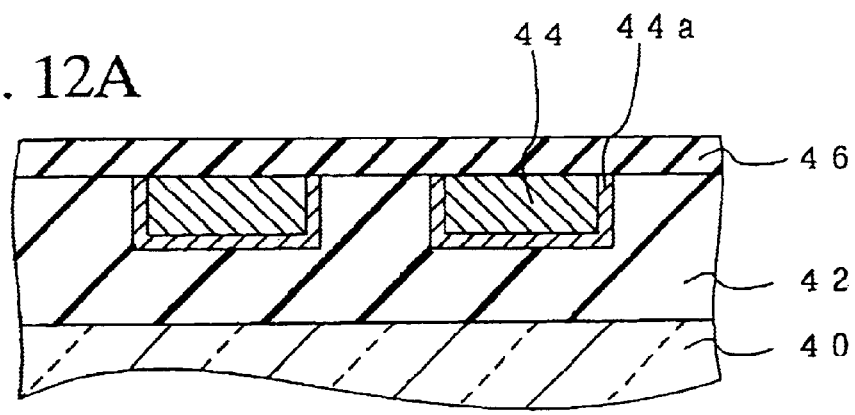
FIGS. 12A to 12E are sectional views showing a semiconductor device manufacturing method according to a third embodiment of the present invention.
Figure 12B:
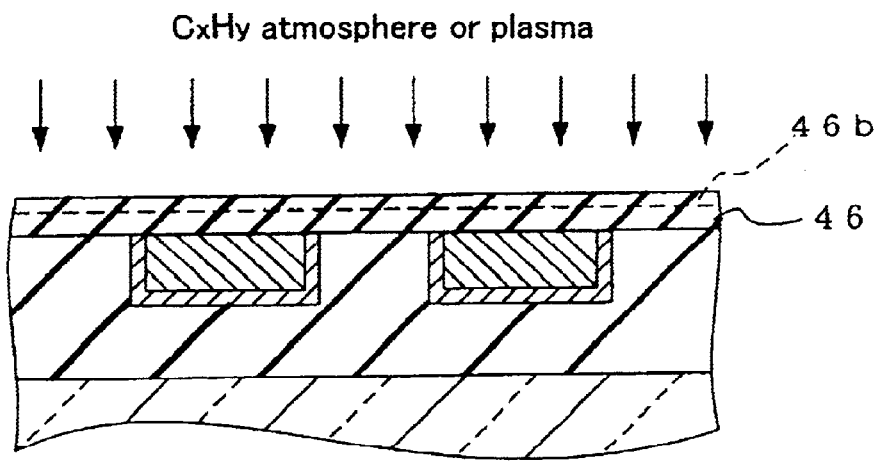
Figure 12C:
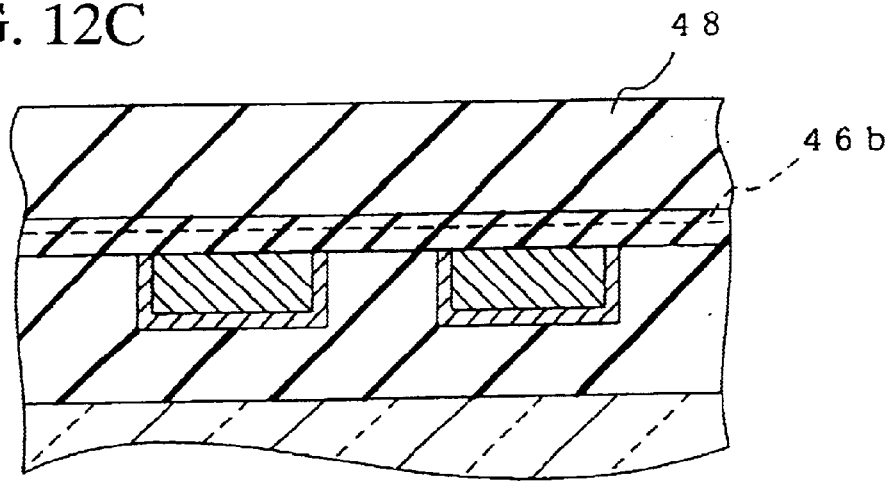
Figure 12D:
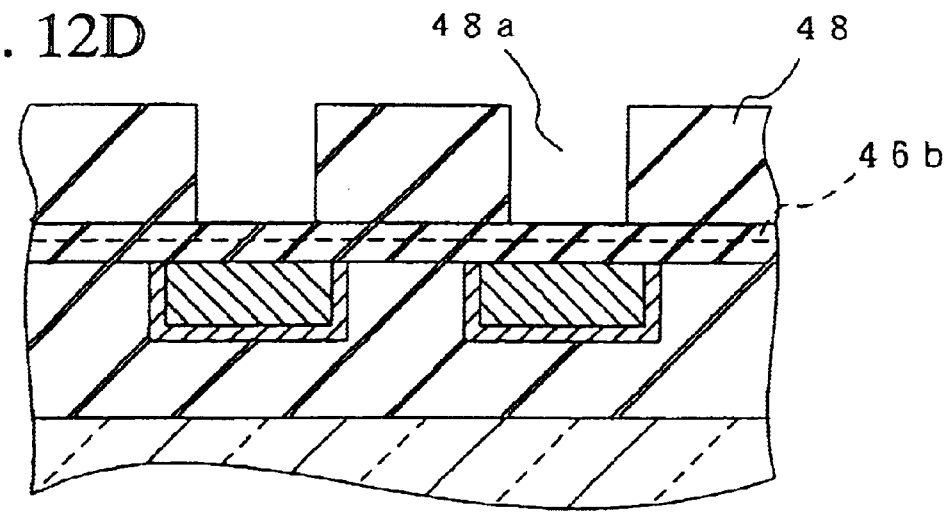

Accordingly, not only the barrier function against the copper particles of the Cu wiring layer 44 but also the etching stopper function used when openings 48a are formed by etching the thick interlayer insulating film 48 formed on the silicon-containing insulating film 46, as shown in FIG. 12D, can be provided to the silicon-containing insulating film 46 by a simple process.

In this third embodiment, the same hydrocarbon (C$_x$H$_y$) gas used in the first embodiment may be employed.

Examples of the third embodiment will be explained with reference to FIGS. 12A to 12C and FIGS. 12D and 13B hereunder.

Figure 12E:
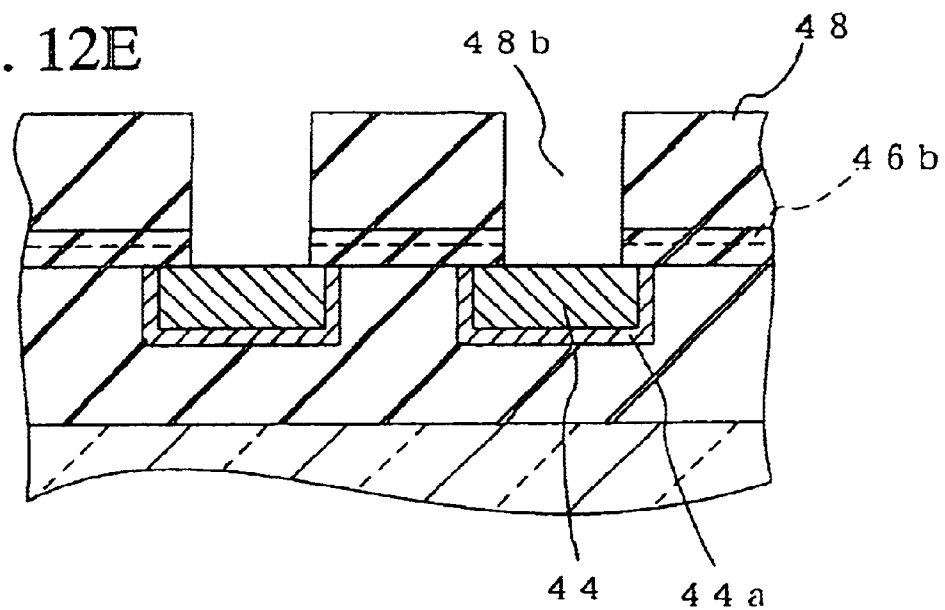

FIGS. 12A to 12E are sectional views showing a semiconductor device manufacturing method according to the third embodiment. The silicon-containing insulating film 46 serving as the barrier insulating film is formed on the buried Cu wiring layer 44 in the same manner as in the second embodiment up to the surface treatment in FIG. 7B. This state is shown in FIG. 12A. Then, as shown in FIG. 12B, the surface treatment is carried out under the above conditions by using an atmosphere or plasma of the hydrocarbon (C$_x$H$_y$) gas, to complete formation of the interlayer insulating film 48 as shown in FIG. 12C. Then, as shown in FIG. 12D, the openings 48a are formed by etching the interlayer insulating film 48 while using the carbon-containing layer 46b as the etching stopper to expose the silicon-containing insulating film 46. Then, as shown in FIG. 12E openings 48b are formed by etching the silicon-containing insulating film 46 via the openings 48a to expose the wiring layer composed mainly of the copper film 44 at their bottoms. Then, the upper wiring layer connected to the wiring layer, i.e., the mainly copper film 44, via the openings 48b, etc. is formed.

In this third embodiment, the compound layer 44b shown in FIG. 2 is not formed on the surface of the copper film 44 before the silicon-containing insulating film 46 is formed. But the compound layer 44b shown in FIG. 2 may be formed.

In the foregoing details of the present invention have been explained with reference to the first to third embodiments. But the scope of the present invention is not limited to the examples that are particularly shown as the above embodiments. Variations and modifications of the above embodiments which do not depart from the gist of the present invention are considered within the scope of the present invention.

What is claimed is:

1. A semiconductor device manufacturing method comprising the steps of:

forming a silicon-containing insulating film directly on a wiring layer composed mainly of copper (Cu), formed over a semiconductor substrate;

exposing the silicon-containing insulating film to an atmosphere or a plasma of a hydrocarbon (C$_x$H$_y$) gas to form a carbon-containing layer as a barrier to diffusion of copper from said wiring layer; and forming a main insulating layer on a surface of the carbon-containing layer.

2. A semiconductor device manufacturing method comprising the steps of:

exposing a surface of a copper (Cu) wiring layer formed over a semiconductor substrate to a plasma of a gas selected from the group consisting of an ammonia gas, a mixed gas of nitrogen and hydrogen, a $CF_4$ gas, a $C_2F_6$ gas and a $NF_3$ gas;

exposing the surface of the copper (Cu) wiring layer to an atmosphere or a plasma of a gas selected from the group consisting of an ammonia gas, an ethylenediamine gas, β-diketone gas, a mixed gas consisting of the ammonia gas and a hydrocarbon gas ($C_xH_y$), and a mixed gas consisting of a nitrogen gas and the hydrocarbon gas ($C_xH_y$); and forming a Cu diffusion preventing insulating film on the copper (Cu) wiring layer.

3. A semiconductor device manufacturing method according to claim 2, wherein the plasma of the mixed gas consisting of the ammonia gas and the hydrocarbon gas ($C_xH_y$), the plasma of the mixed gas of the nitrogen gas and the hydrocarbon gas ($C_xH_y$), or the plasma of the nitrogen gas is any one of an LF (Low Frequency) plasma and an RF (Radio Frequency) plasma.

4. A semiconductor device manufacturing method according to claim 2, wherein the hydrocarbon gas ($C_xH_y$) is selected from the group consisting of methane ($CH_4$), acetylene ($C_2H_2$), ethylene ($C_2H_4$), propane ($C_3H_8$), butylene ($C_4H_8$), butane ($C_4H_{10}$), benzene ($C_6H_6$), cyclohexane ($C_6H_{12}$), and methylcyclohexane ($C_7H_{14}$).

5. A semiconductor device manufacturing method according to claim 2 wherein the first recited exposing removes a natural oxide film from the surface of the copper wiring layer and the second recited exposing step forms a compound layer or complex layer at the surface of the copper wiring layer.

6. A semiconductor device manufacturing method comprising the steps of:

exposing a surface of a copper (Cu) wiring layer formed over a semiconductor substrate to a plasma of an ammonia gas;

forming a silicon-containing insulating film on the copper (Cu) wiring layer; and exposing the silicon-containing insulating film to an atmosphere or a plasma selected from the group consisting of an atmosphere or a plasma of a mixed gas consisting of an ammonia gas and a hydrocarbon gas ($C_xH_y$), an atmosphere or a plasma of a mixed gas consisting of a nitrogen gas and the hydrocarbon gas ($C_xH_y$), a plasma of the nitrogen gas, and an atmosphere of the ammonia gas.

7. A semiconductor device manufacturing method according to claim 6, wherein the silicon-containing insulating film is imparted with a Cu diffusion preventing function by exposing the silicon-containing insulating film to the atmosphere or the plasma of the gas.

8. A semiconductor device manufacturing method according to claim 6 wherein the step of exposing a surface of a copper wiring layer to the plasma of an ammonia gas removes a natural oxide film from the surface of the copper oxide layer.

9. A semiconductor device manufacturing method comprising the steps of:

exposing a surface of a copper (Cu) wiring layer formed over a semiconductor substrate to a plasma of an ammonia gas;

forming a silicon-containing insulating film on the copper (Cu) wiring layer; and exposing the silicon-containing insulating film to an atmosphere or a plasma of an ammonia gas or a plasma of a nitrogen gas, and then exposing the silicon-containing insulating film to an atmosphere or a plasma of a hydrocarbon gas ($C_xH_y$).

10. A semiconductor device manufacturing method according to claim 9 wherein the step of exposing a surface of a copper wiring layer to the plasma of an ammonia gas removes a natural oxide film from the surface of the copper oxide layer.

11. A semiconductor device manufacturing method comprising the steps of:

exposing a surface of a copper (Cu) wiring layer formed over a semiconductor substrate to a plasma of an ammonia gas;

forming a silicon-containing insulating film on the copper (Cu) wiring layer; and exposing the silicon-containing insulating film to an atmosphere or a plasma of a hydrocarbon gas ($C_xH_y$), and then exposing the silicon-containing insulating film to an atmosphere or a plasma of an ammonia gas or a plasma of a nitrogen gas.

12. A semiconductor device manufacturing method according to claim 11 wherein the step of exposing a surface of a copper wiring layer to the plasma of an ammonia gas removes a natural oxide film from the surface of the copper oxide layer.

* * * * *

UNITED STATES PATENT AND TRADEMARK OFFICE
CERTIFICATE OF CORRECTION

PATENT NO. : 6,713,383 B2
DATED : March 30, 2004
INVENTOR(S) : Shioya et al.

It is certified that error appears in the above-identified patent and that said Letters Patent is hereby corrected as shown below:

<u>Title page,</u>
Item [57], ABSTRACT,
Line 8, "f'A-diketone" should read -- β-diketone --.

<u>Column 2,</u>
Line 63, "f'A-diketone" should read -- β-diketone --.

<u>Column 6,</u>
Lines 29, 36 and 38, "f'A-diketone" should read -- β-diketone --.

Signed and Sealed this

First Day of February, 2005

JON W. DUDAS
*Director of the United States Patent and Trademark Office*